United States Patent [19]

Sachitano et al.

[11] Patent Number: 4,826,782
[45] Date of Patent: May 2, 1989

[54] METHOD OF FABRICATING ALDD FIELD-EFFECT TRANSISTOR

[75] Inventors: Jack Sachitano, Portland; Paul K. Boyer, Beaverton, both of Oreg.; Hee K. Park, Seoul, Rep. of Korea; Gregory C. Eiden, Madison, Wis.

[73] Assignee: Tektronix, Inc., Beaverton, Oreg.

[21] Appl. No.: 40,447

[22] Filed: Apr. 17, 1987

[51] Int. Cl.$^4$ .......................................... H01L 21/265
[52] U.S. Cl. ....................... 437/44; 437/41; 437/46; 437/162; 357/23.3; 148/DIG. 30
[58] Field of Search ................. 437/41, 44, 162, 40, 437/46, 154, 233; 357/23.3, 23.11, 59 G, 23.9; 148/DIG. 30, DIG. 123

[56] References Cited

U.S. PATENT DOCUMENTS

| 4,453,306 | 6/1984 | Lynch et al. | 437/201 |
| 4,471,522 | 9/1984 | Jamboktar | 29/571 |
| 4,735,916 | 4/1988 | Homma et al. | 437/162 |

FOREIGN PATENT DOCUMENTS 0106458 4/1984 European Pat. Off.
86/07190 12/1986 PCT Int'l Appl.

OTHER PUBLICATIONS

Higashisaka et al., "Sidewall-Assisted Closely Spaced Electrode Technology for High Speed GaAs LSIs", Extended Abstracts of the 15th Conference on Solid State Devices and Materials, Tokyo, 1983, pp. 69–72.
Tsang et al., "Fabrication of High-Performance LDDFETs with Oxide Sidewall Spacer Technology," IEEE Journal of Solid State Circuits, vol. SC-17, No. 2, Apr. 1982, pp. 220–226.
"A New MOSFET Structure with Self-Aligned Polysilicon Source & Drain Electrodes" C. S. Oh & C. K. Kim, IEEE Electron Device Letters, vol. EDL-5, 1984, pp. 400–402.
"Elevated Source/Drain MOSFET", S. S. Wong, D. C. Bradbury, D. C. Chen & K. Y. Chiu, IEDM Tech. Dig. 1984, pp. 634–637.
"Contact Technologies for Submicron CMOS", S. S. Wong, Cornell Program on Submicrometer Structures, 1985.
"Trends in Advanced Process Technology-Submicrometer CMOS Device Design & Process Requirements", D. M. Brown, M. Ghezzo, J. H. Pimbley, Proc. IEEE, vol. 44, No. 12, 1986, pp. 1678–1702.
(List continued on next page.)

Primary Examiner—Brian E. Hearn
Assistant Examiner—Mary Wilczewski
Attorney, Agent, or Firm—William S. Lovell; John Smith-Hill

[57] ABSTRACT

An intermediate structure in the fabrication of a metal-oxide semiconductor field-effect transistor is made from a substrate of p+ silicon having an elongate insulated gate structure on its main face. First and second areas of the main face are exposed along first and second opposite sides respectively of the gate structure. Donor impurity atoms are introduced into the substrate by way of at least the first area of the main face, to achieve a predetermined concentration of electrons in a region of the substrate that is subjacent the first area of the main face. The gate structure is opaque to the impurity atoms. A sidewall of silicon dioxide is formed along the first side of the gate structure, whereby a strip of the first area of the main face is covered by the sidewall and other parts of the first area remain exposed adjacent the sidewall. Donor impurity atoms to which the gate structure and the sidewall are opaque are introduced into the substrate by way of the portion of the first area that is exposed adjacent the sidewall. A layer of polysilicon is disposite over the portion of the first area of the main face that is exposed adjacent the sidewall. This layer extends up the sidewall and over the gate structure. A layer of a polymer material is formed over the layer of polysilicon to a substantially uniform height over the main face. The height of the free surface of the layer of polymer material is at least as great as the maximum height of the layer of polysilicon over the gate structure. The polysilicon at a height that is at least as great as that of the gate structure is then removed.

7 Claims, 2 Drawing Sheets

OTHER PUBLICATIONS

"A MOS Transistor with Self Aligned Polysilicon Source Drain", T-Y. Huang, I-W. Wu, & J. Y. Chen, IEEE Electron Device Letters, vol. EDL-7, No. 5, 1986, pp. 314–316.

"Planarization of Phosphorous Doped Silicon Dioxide", A. C. Adams, & C. D. Capio, J. Electrochem. Soc., vol. 128(2), 1981, p. 423.

"Planarization Phenomena in Multilayer Resist Processing", L. K. White, J. Vac. Sci. Technol., vol. B1(4), 1983, p. 1235.

"Planaration of Properties of Resist & Polyimide Coatings", L. K. White, J. Electrochem. Soc., vol. 130(7), 1983, p. 1543.

"Selective Silicon Epitaxy Using Reduced Pressure Techniques", K. Tanno, N. Endo, H. Kitajima, Y. Kurogi, & H. Tsuya, Jpn. J. Appl. Phys., vol. 21, 1982, pp. L564.

METHOD OF FABRICATING ALDD FIELD-EFFECT TRANSISTOR

This invention relates to a method of fabricating a field-effect transistor.

BACKGROUND OF THE INVENTION

A metal-oxide-semiconductor field-effect transistor (MOSFET) of conventional form is shown in FIG. 1. The conventional MOSFET comprises a substrate 2 of p+silicon having source and drain regions 4 and 6 of n+material formed therein immediately beneath the upper surface 8 of the substrate. The source and drain regions are bounded by CVD or thermally-formed field oxide 9, and are separated by a channel region 10, in which the p+material of the substrate extends to the upper surface 8. A thin layer 12 of thermally-formed silicon dioxide overlies the channel region and the immediately adjacent margins of the source and drain regions 4 and 6, and a gate 14 of polysilicon overlies the layer 12. A layer 16 of silicon dioxide is formed by chemical vapor deposition over the source and drain regions and over the gate 14, and holes 18 and 20 are formed in the layer 16, so as to expose the source and drain regions 4 and 6 respectively. A third hole (not shown) is formed out of the plane of the drawing so as to expose the gate 14. Metal, e.g. aluminum, is deposited over the layer 16 and enters the holes in the layer 16. The metal is selectively removes so as to form distinct source and drain electrodes 22 and 24 and a gate electrode (not shown). When the electrodes 22 and 24 are connected to ground and a positive voltage respectively, and the gate is at ground potential, the source and drain regions are electrically isolated by the pn junction between the drain region 6 and the channel region 10. When the voltage at the gate is increased, an inversion layer is formed in the channel region immediately beneath the gate, and electrons are able to flow from the source region 4 to the drain region 6 through this inversion layer.

Among the important operating parameters of a MOSFET are its operating speed, the source/drain breakdown voltage when the device is in its non-conductive state, and the resistance between the source and drain electrodes when the device is in its conductive state. It is generally desirable that the operating speed and the source/drain breakdown voltage be maximized and that the source/drain resistance be minimized.

In order to minimize the source/drain resistance, it is necessary that the source and drain electrodes be placed as close as possible to the gate structure. In the conventional MOSFET shown in FIG. 1, the holes 18 and 20 for receiving the source and drain electrodes are formed by a photoprocessing operation that involves aligning a mask relative to the gate 14, and the electrodes 22 and 24 make contact directly to the source and drain regions respectively. In order to allow for error in alignment of the mask used to form the holes 18 and 20, yet ensure that the electrodes 22 and 24 will make contact to the source and drain regions, the distance between the gate oxide and the field oxide on each side of the gate must be made quite large.

The operating speed of a MOSFET depends on the capacitance of the pn junctions between the bulk semiconductor material and the source and drain regions respectively and on the channel length (the horizontal dimension of the channel region in the plane of FIG. 1). The capacitance of the pn junctions depends on the area of the interfaces between the bulk material and the source and drain regions respectively, and this area in turn depends on the area of the surface 8 exposed on each side of the gate oxide 12. Therefore, in order to obtain high speed operation, it is necessary to minimize the exposed area of the surface 8. For a given channel width (the dimension of the channel region in the direction perpendicular to the plane of FIG. 1), this implies that the distance between the gate oxide and the field oxide must be minimized.

C. S. Oh and C. K. Kim "A New MOSFET Structure with Self-Aligned Polysilicon Source and Drain Electrode," IEEE Electron Device Letters, vol. EDL-5, 1984, pages 400–402, discloses a MOSFET in which the source and drain contacts are perfectly aligned relative to the source and drain regions. The source and drain electrodes are positioned over the field oxide. Therefore, the distance between the gate oxide and the field oxide can be made much smaller than in the case of the FIG. 1 device, with the result that higher speed operation is possible.

In order to minimize the channel length (and therefore maximize the operating speed), the regions of the pn junctions that are immediately adjacent the channel region must be lightly doped. In addition, in order to maximize the source/drain breakdown voltage of a MOSFET, it is desirable that the drain region be lightly doped immediately adjacent the channel region. However, it is desirable that the major parts of the source and drain regions be more heavily doped, in order to keep the source/drain resistance to a minimum when the MOSFET is in its conductive state. This implies that it is desirable that the source and drain regions each be in two zones, namely a lightly doped zone that extends at least partially under the gate, and a more heavily doped zone that connects the lightly doped zone to the source or drain electrode.

A known method of providing different doping levels within the drain region of a MOSFET is illustrated in FIG. 2. As shown in FIG. 2(a), the gate structure 12/14 is formed on the substrate 2 and a first ion implantation operation is carried out, providing a relatively low concentration of charge carriers in regions 20 on each side of the gate structure. A silicon dioxide layer 24 of uniform thickness is deposited over the gate structure and the adjacent areas of the upper surface of the substrate (FIG. 2(b)). The silicon dioxide of the layer 24 is removed by anisotropic reactive ion etching to a depth equal to the thickness of the layer 24, so as to leave walls 26 extending along the sides of the gate structure 12/14 (FIG. 2(c)). A second ion implantation is then carried out, providing a higher concentration of charge carriers, and with the sidewalls 26 acting as an implantation mask. Therefore, the source and drain regions each have two zones 28 and 30, of high and low conductivity respectively. For ease of processing, the same operations are carried out on the source side of the gate.

The method described by Oh and Kim does not lend itself to the establishment of different doping levels within the drain region.

In S. S. Wong, D. R. Bradbury, D. C. Chen and K. Y. Chiu, "Elevated Source/Drain MOSFET," IEDM Tech. Dig., 1984, pages 634–637, there is described a method for providing a high conductivity layer over the source and drain regions of a MOSFET by forming an epitaxial layer of silicon over the source and drain regions, but not over the gate structure, and implanting ions into the epitaxial layer and the gate structure. However, this method is subject to disadvantage in that deposition of an epitaxial layer is normally carried out at high temperature, and high temperature processing is considered undesirable in fabrication of a MOSFET having a lightly-doped drain.

S. S. Wong, "Contact Technologies for Submicron CMOS," Cornell Program on Submicrometer Structures, 1985, discusses the use of a metal silicide contact layer over the source and drain regions to minimize the source/drain resistance. The silicide layer is formed by first depositing a layer of polysilicon over the source and drain regions and then depositing of a layer of refractory metal over the polysilicon. The device is then annealed, and the metal silicide layer is formed D. M. Brown, M. Ghezzo and J. H. Pimbley, "Trends in Advanced Process Technology-Submicrometer CMOS Device Design and Process Requirements," Proc. IEEE, vol. 44, No. 12, 1986, pages 1678–1702, contains a general survey of the state of the art relating to the manufacture of CMOS devices. T-Y. Huang, I-W. Wu and J. Y. Chen, "A MOS Transistor with Self-Aligned Polysilicon Source-Drain," IEEE Electron Device Letters, vol. EDL-7, No. 5, 1986, pages 314–316, discloses an n-channel MOSFET with self-aligned source and drain regions and with a lightly-doped zone in the drain region.

SUMMARY OF THE INVENTION

In a preferred embodiment of the invention, an intermediate structure in the fabrication of a metal-oxide semiconductor field-effect transistor is made from a substrate of semiconductor material having a main face and containing impurity ions that provide charge carriers of a first polarity. The substrate has an elongate insulated gate structure on its main face. First and second areas of the main face are exposed along first and second opposite sides respectively of the gate structure. Impurity atoms that provide charge carriers of a second polarity, opposite the first polarity, are introduced into the substrate by way of at least the first area of the main face, to achieve a predetermined concentration of charge carriers of the second polarity in a drain region of the substrate that is subjacent the first area of the main face. The gate structure is opaque to the impurity atoms, and therefore the drain region does not extend fully under the gate structure. Nevertheless, the drain region has a channel-side zone which lies under the margin of the gate at the first side thereof. A sidewall of a selected material is formed along the first side of the gate structure, whereby a strip of the first area of the main face is covered by the sidewall and other parts of the first area remain exposed adjacent the sidewall. Atoms of a selected impurity, to which the gate structure and the sidewall are opaque, are introduced into the substrate by way of the portion of the first area that is exposed adjacent the sidewall. The atoms of the selected impurity provide charge carriers of the second polarity. A zone that extends partially within the drain region, but does not extend fully under the sidewall, and in which the conductivity is provided by charge carriers of the second polarity and is higher than that in the channel-side zone of the drain region, is created. A layer of conductive material is deposited over the portion of the first area of the main face that is exposed adjacent the sidewall. This layer extends up the sidewall and over the gate structure. A layer of a selected material is formed over the layer of conductive material to a substantially uniform height over the main face. The height of the free surface of the layer of selected material is at least as great as the maximum height of the layer of conductive material over the gate structure. The selected material is removed uniformly over the free surface of the layer so as to expose the layer of conductive material over the gate structure only. The conductive material at a height that is at least as great as that of the gate structure is then removed.

BRIEF DESCRIPTION OF THE DRAWINGS

For a better understanding of the invention, and to show how the same may be carried into effect, reference will now be made, by way of example, to the accompanying drawings in which.

In the different figures, like reference numerals denote like elements.

DETAILED DESCRIPTION

Figure 1:
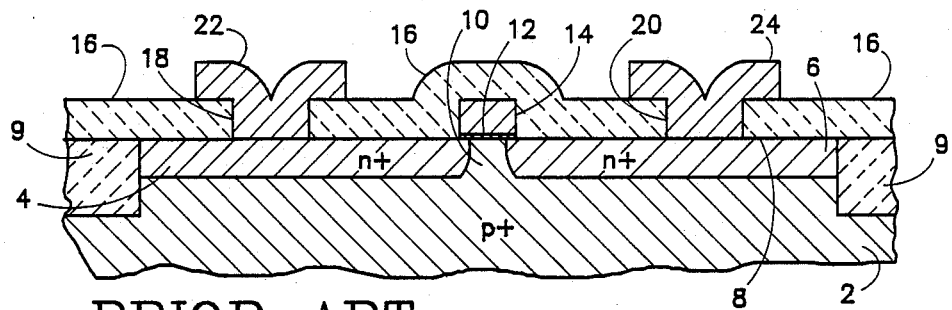
FIG. 1 is a schematic sectional view of a conventional MOSFET structure.
Figure 2A:
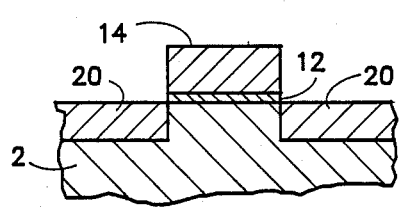
FIG. 2 is a series of views illustrating formation of an oxide box about the gate of a MOSFET.
Figure 2B:
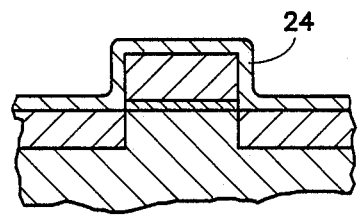
Figure 2C:
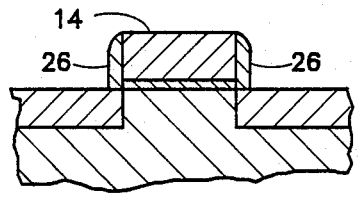
Figure 2D:
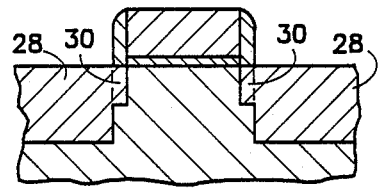
Figure 3A:
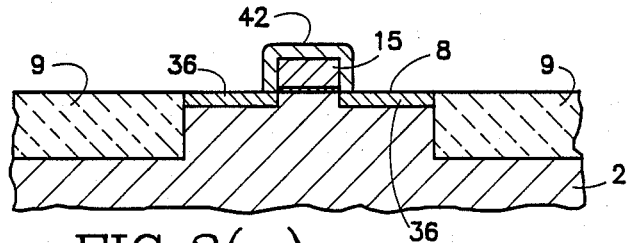
FIG. 3 is a series of views illustrating fabrication of a MOSFET by a method embodying the present invention.
Figure 3B:
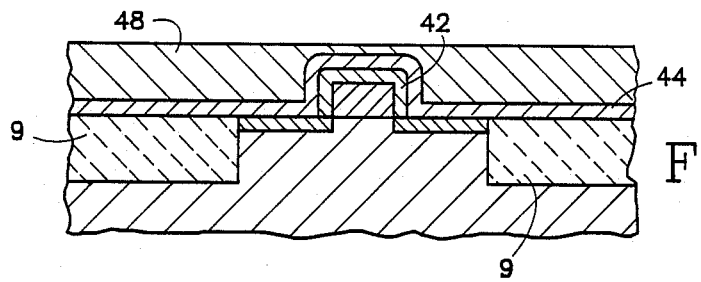

A substrate 2 of p+silicon is processed to produce the structure shown in FIG. 3(a), having a gate structure 15 enclosed in an oxide box 42. The oxide box may be formed, for example, by depositing a layer of silicon dioxide over the polysilicon gate layer before the gate is patterned, patterning the silicon dioxide, using the remaining silicon dioxide as an etching mask to pattern the polysilicon gate layer, and then creating sidewalls by the technique described with reference to FIG. 2. A region 36 of the substrate on each side of the gate structure is lightly doped with n type material. A layer 44 of polysilicon is deposited over the main surface 8 of the substrate and extends over the oxide box 42 and the field oxide 9. The polysilicon is doped with n type material, such as arsenic, by ion implantation. A layer 48 of synthetic polymer material is applied to the FIG. 3(a) structure. The free surface of the layer 48 is planar and is parallel to the upper surface of the wafer, and the maximum depth of the layer 48 is sufficient that the layer 44 is fully covered. The layer 48 of polymer material is applied by a method known as polymer planarization, which is described in A. C. Adams and C. D. Capio, "Planarization of Phosphorous Doped Silicon Dioxide," J. Electrochem. Soc., vol. 128(2), 1981, page 423; L. K. White, "Planarization Phenomena in Multilayer Resist Processing," J. Vac. Sci. Technol., vol. B1(4), 1983, page 1235; and L. K. White, "Planarization Properties of Resist and Polyimide Coatings," J. Electrochem. Soc., vol. 130(7), 1983, page 1543.

Figure 3C:
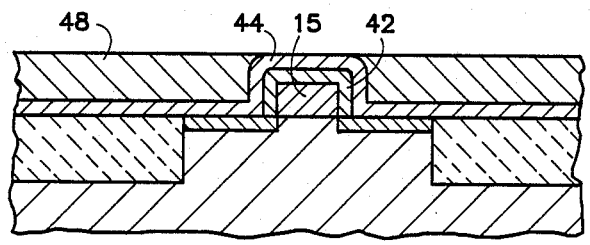
Figure 3D:
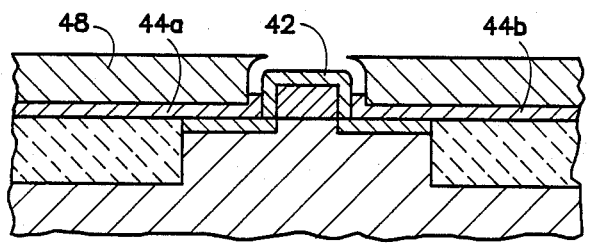
Figure 3E:
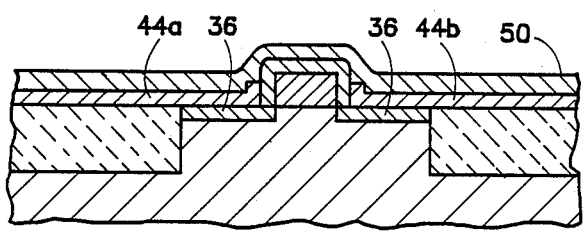
Figure 3F:
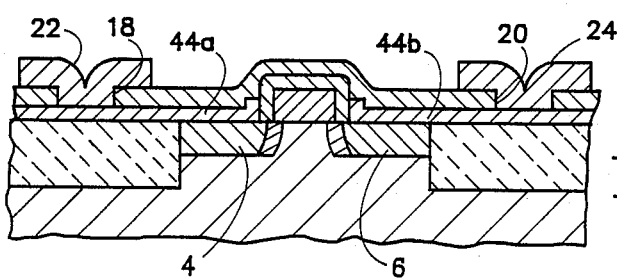

The polymer material is exposed to an etchant which etches the polymer material in a direction primarily perpendicular to the surface 8. This etching continues until the layer 44 is exposed over the oxide box 42 (FIG. 3(c)). An etchant may be chosen which etches both the polymer material and polysilicon at substantially the same rate. A further etching operation which demonstrates a controlled degree of anisotropy is then carried out, employing an etchant which attacks polysilicon but does not attack either the polymer material or silicon dioxide. The second etching operation is carried out in the direction perpendicular to the upper surface 8 of the substrate until the free surface of the polysilicon is below the top of the oxide box 42 (FIG. 3(d)). In this manner, the layer 44 is divided into two portions 44a and 44b which overlie the source and drain regions 4 and 6 respectively and form source and drain contacts. The polymer material 48 is removed, and a layer 50 of silicon dioxide is deposited over the contacts 44a and 44b and over the oxide box that lies therebetween (FIG. 3(e)). An annealing operation is then carried out. During the annealing, n type impurity atoms diffuse from the polysilicon layer 44 into the substrate, forming n+ zones in the source and drain regions, and n type impurity atoms in the regions 36 diffuse at least partly under the sidewalls of the oxide box. Thus, the drain region 6 is lightly doped immediately adjacent the channel region and is more heavily doped elsewhere. By use of diffusion of impurity atoms from the layer 42 to establish the more heavily doped zones of the source and drain regions, instead of ion implantation, very shallow pn junctions are formed between the source and drain regions and the substrate. In the case of the impurity's being arsenic, the junctions are typically at a depth of less than 0.1 $\mu$m. Holes 18 and 20 (FIG. 3(f)) are formed in the layer 50 in conventional manner to expose the source and drain contacts respectively, and a third hole (not shown) is formed to expose the gate. Metal is deposited over the layer 50 in conventional fashion and enters the holes in the layer 50. The metal is selectively removed to form discrete source and drain electrodes 22 and 24 and a gate electrode (not shown).

By use of the process describd with reference to FIG. 3, it is possible to provide a MOSFET structure having self-aligned source and drain contacts and a lightly-doped drain.

It will be appreciated that the present invention is not restricted to the particular method and structure that have been described, and that variations may be made therein without departing from the scope of the invention as defined in the appended claims and equivalents thereof. The invention is not restricted to use with a p+ substrate and n type source and drain regions, and may be applied to a substrate of n+ material with p type source and drain regions. If an n+ substrate and p type source and drain regions are required, the impurity implanted into the polysilicon might be boron, in which case the junctions formed between the n+ substrate and the p type source and drain regions following the annealing operation would normally be at a depth of less than 0.2 $\mu$m. If shallow junctions are not required, the impurity atoms could be introduced into the source and drain regions by ion implantation. In this case, the thermal treatment for diffusing dopant from the polysilicon into the substrate is not required, and this provides a greater degree of control over the configuration of the source and drain regions, and particularly the lightly-doped zone of the drain region. The sheet resistance of the contacts 44a and 44b may be reduced by partial conversion of the layer 44 to silicide, e.g. by depositing a layer of refractory metal over the layer 44 and then annealing the refractory metal to form a low-resistivity silicide. Instead of removing the silicon dioxide of the layer that is used to form the sidewalls of the oxide box 42 by etching, so as to expose the surface 8 along the edges of the gate structure 15, holes may be formed in the silicon dioxide layer so as to expose the surface 8 and silicon could be grown epitaxially on the substrate to provide source and drain contacts. A technique for epitaxial growth of silicon on a selected area of a silicon substrate is described in K. Tanno. N. Endo, H. Kitajima, Y. Kurogi and H. Tsuya, "Selective Silicon Epitaxy Using Reduced Pressure Techniques," Jpn. J. Appl. Phys., vol. 21, 1982, page L564. However, this technique is subject to disadvantage in the event that a lightly-doped drain is required, since it involves thermal treatment at a relatively high temperature. The etching operation that is described with reference to FIG. 3(d) may be carried out using an etchant that etches both polysilicon and the polymer material. However, it is preferred that an etchant that attacks polysilicon but not the polymer material be used.

We claim:

1. A method of fabricating a metal-oxide-semiconductor field-effect transistor having a lightly-doped drain extension, comprising the following steps:

(a) providing a substrate of semiconductor material having charge carriers of a first polarity, the substrate having a main face and an elongate insulated gate structure on its main face, and first and second areas of the main face being exposed along first and second opposite sides respectively of the gate structure, (b) introducing impurity atoms that provide charge carriers of a second polarity, opposite said first polarity, into the substrate by way of said first area of the main face, the gate structure being effective to mask the region of the substrate that is immediately subjacent the gate structure from the impurity atoms, thereby forming a first doped zone which extends partly under the gate structure and is doped to a low impurity concentration, (c) forming a sidewall of a masking material that is opaque to atoms of a selected impurity along at least said first side of the gate structure, whereby a strip of the main face along said first side of the gate structure is covered by the sidewall but other parts of the first area of the main face remain exposed, the atoms of the selected impurity providing charge carriers of said second polarity, (d) forming a layer of conductive material over said portion of said first area, over said second area, and over the gate structure, the layer of conductive material being doped with atoms of the selected impurity, (e) heating the layer of conductive material and the substrate, whereby atoms of the selected impurity diffuse from the layer of conductive material into the substrate and impurity atoms diffuse within the substrate, thereby forming a second doped zone of a higher impurity concentration than said first doped zone, and (f) removing the conductive material of said layr that is at a height over the main face that is at least as great as that of the gate structure so as to form two discrete contacts overlying said first and second areas respectively of the main face.

2. A method according to claim 1, wherein step (f) is accomplished by forming a layer of a selected material over the layer deposited in step (c), the layer of selected material having a free surface that is substantially parallel to the main face of the substrate, removing said selected material anisotropically, in a direction substantially perpendicular to said main face, until said layer of conductive material is exposed over the gate structure but not over said first area or said second area, and anisotropically removing said conductive material in a direction substantially perpendicular to said main face until the maximum height of said conductive material over said main face is less than the maximum height of the gate structure.

3. A method according to claim 2, wherein the step of anisotropically removing the conductive material is performed by etching, and the etchant is effective to remove the conductive material but not said selected material.

4. A method according to claim 2, comprising removing said selected material concurrently with said conductive material.

5. A method according to claim 1, wherein the sidewall is formed in step (c) by forming a layer of said masking material over said first and second areas and over the gate structure, and removing said masking material to a depth, perpendicular to said main face, that is substantially equal to the thickness of the layer of masking material.

6. A·method of fabricating a metal-oxide-semiconductor field-effect transistor by a method in accordance with claim 1 and subsequently depositing a layer of dielectric material over said discrete contacts and over the gate structure, forming holes in the layer of dielectric material to expose the two discrete contacts and the gate structure, and depositing metal into said holes.

7. A method according to claim 6, wherein the first and second areas of the main face of the substrate are bounded respectively by first and second bodies of dielectric material and said two discrete contacts extend over said first and second bodies respectively, and the method comprises forming said holes at locations that lie over said first and second bodies respectively.

* * * * *